(12) United States Patent
Lin et al.

(10) Patent No.: US 12,125,748 B2
(45) Date of Patent: Oct. 22, 2024

(54) CONTACT PLUG

(71) Applicant: Taiwan Semiconductor Manufacturing Co., Ltd., Hsinchu (TW)

(72) Inventors: Chih-Hsuan Lin, Hsinchu (TW); Xi-Zong Chen, Tainan (TW); Chih-Teng Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 7 days.

(21) Appl. No.: 17/868,927

(22) Filed: Jul. 20, 2022

(65) Prior Publication Data
US 2022/0367269 A1 Nov. 17, 2022

Related U.S. Application Data

(63) Continuation of application No. 17/142,750, filed on Jan. 6, 2021, now Pat. No. 11,798,846.
(Continued)

(51) Int. Cl.
*H01L 21/768* (2006.01)
*H01L 21/285* (2006.01)

(52) U.S. Cl.
CPC .. *H01L 21/76897* (2013.01); *H01L 21/28518* (2013.01); *H01L 21/76829* (2013.01); *H01L 21/76846* (2013.01); *H01L 21/7685* (2013.01)

(58) Field of Classification Search
CPC ......... H01L 21/76897; H01L 21/28518; H01L 21/6829; H01L 21/76846; H01L 21/7685; H01L 21/76814; H01L 21/76804; H01L 21/76831; H01L 21/76843; H01L 21/76855; H01L 21/76865;
(Continued)

(56) References Cited

U.S. PATENT DOCUMENTS

| 6,074,954 A | * | 6/2000 | Lill | ...................... H10B 12/038 438/719 |
| 6,509,267 B1 | | 1/2003 | Woo | |

(Continued)

FOREIGN PATENT DOCUMENTS

| KR | 20160003539 A | 1/2016 |
| KR | 20180060943 A | 6/2018 |

(Continued)

*Primary Examiner* — Dale E Page
*Assistant Examiner* — Quovaunda Jefferson
(74) *Attorney, Agent, or Firm* — HAYNES AND BOONE, LLP

(57) ABSTRACT

The present disclosure provides embodiments of a semiconductor device. In one embodiment, the semiconductor device includes a gate structure, a source/drain feature adjacent the gate structure, a first dielectric layer over the source/drain feature, an etch stop layer over the gate structure and the first dielectric layer, a second dielectric layer over the etch stop layer, a source/drain contact that includes a first portion extending through the first dielectric layer and a second portion extending through the etch stop layer and the second dielectric layer, a metal silicide layer disposed between the second portion and etch stop layer, and a metal nitride layer disposed between the first portion and the first dielectric layer.

20 Claims, 12 Drawing Sheets

Related U.S. Application Data

(60) Provisional application No. 63/071,194, filed on Aug. 27, 2020, provisional application No. 63/065,630, filed on Aug. 14, 2020.

(58) Field of Classification Search
CPC ....... H01L 21/76805; H01L 21/823431; H01L 21/76816; H01L 21/76835; H01L 23/5226; H01L 23/485; H01L 27/0886
See application file for complete search history.

(56) References Cited

U.S. PATENT DOCUMENTS

| | | | |
|---|---|---|---|
| 9,252,019 B2 * | 2/2016 | Tsai | ................ H01L 21/28518 |
| 9,520,362 B2 | 12/2016 | Lin et al. | |
| 9,613,856 B1 | 4/2017 | Yang et al. | |
| 9,716,032 B2 | 7/2017 | Tang et al. | |
| 9,972,529 B2 | 5/2018 | Yang et al. | |
| 10,083,863 B1 * | 9/2018 | Hsieh | ................ H01L 21/32134 |
| 10,163,691 B2 | 12/2018 | Shih et al. | |
| 10,170,322 B1 | 1/2019 | Cheng et al. | |
| 10,177,038 B1 * | 1/2019 | Lee | ................ H01L 23/485 |
| 2007/0132100 A1 * | 6/2007 | Ikeda | ................ C23C 14/16 |
| | | | 257/E23.145 |
| 2009/0236746 A1 | 9/2009 | Kitamura | |
| 2011/0221009 A1 | 9/2011 | Chuang | |
| 2013/0049219 A1 * | 2/2013 | Tsai | ................ H01L 21/02063 |
| | | | 257/774 |
| 2016/0005824 A1 | 1/2016 | Lin et al. | |
| 2018/0151429 A1 | 5/2018 | Wang et al. | |
| 2018/0254246 A1 | 9/2018 | Park et al. | |
| 2019/0006230 A1 | 1/2019 | Kuo | |
| 2019/0088542 A1 | 3/2019 | Hsieh et al. | |

FOREIGN PATENT DOCUMENTS

| | | |
|---|---|---|
| KR | 20180131346 A | 12/2018 |
| TW | 202008509 A | 2/2020 |

* cited by examiner

CONTACT PLUG

PRIORITY DATA

The present application is a continuation of U.S. patent application Ser. No. 17/142,750, filed Jan. 6, 2021, which claims the benefit of U.S. Provisional Application No. 63/071,194, entitled "Contact Plug," filed Aug. 27, 2020 and U.S. Provisional Application No. 63/065,630, entitled "Contact Plug," filed Aug. 14, 2020, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, controlling source/drain series resistance within tolerable limits becomes much more difficult. Specifically, copper plug technology struggles to keep up with aggressive device performance. Therefore, while existing contact plug structures are generally satisfactory for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
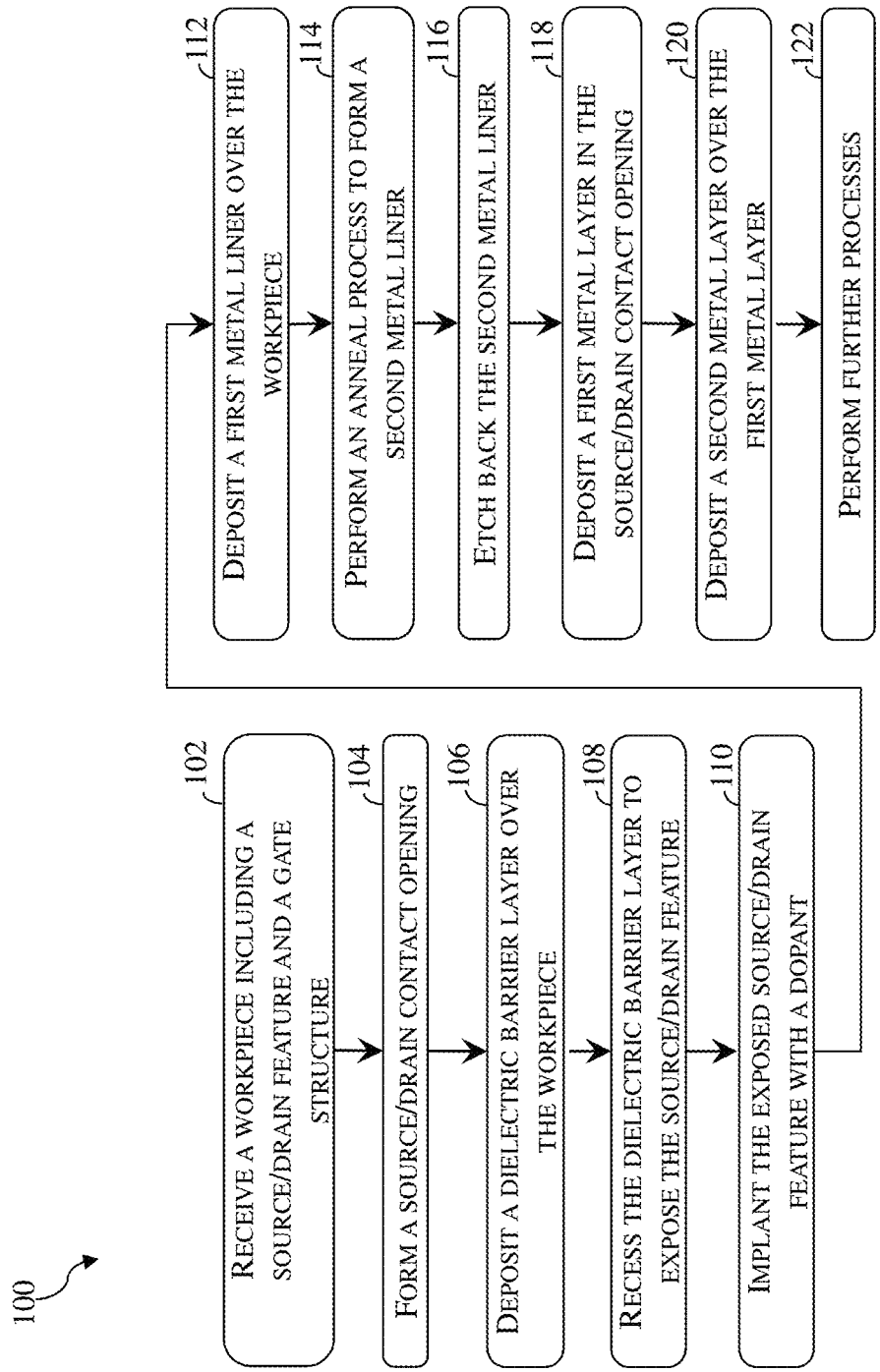
FIG. 1 is a flowchart illustrating a method of fabricating a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to contact structures for semiconductor devices, and more particularly to source/drain contact structures.

As IC devices progress to smaller technology nodes, controlling source/drain series resistance within tolerable limits becomes much more difficult. Due to the increase of current density as a result of smaller dimensions, the demand for lower resistance poses a great challenge. It is estimated that in current technologies, series resistance may degrade the saturation current by 40% or more. On top of this, increase of interconnect resistance due to scaling is expected to necessitate much lower resistance values for the device contact. In order to maximize the benefits of high-mobility channels in the drain current, it becomes important to reduce the contact resistance. Copper, being used as the material for contact features, is unlikely to meet the aggressive contact resistance device performance specification.

The present disclosure provides methods for forming contact structures to improve the contact resistance (Rcsd) at the source/drain regions. In an example embodiment, a workpiece is received. The workpiece includes a gate structure, a source/drain feature adjacent the gate structure, a first dielectric layer over the source/drain feature, an etch stop layer over the first dielectric layer, and a second dielectric layer over the etch stop layer. A source/drain contact opening is formed through the second dielectric layer, the etch stop layer, and the first dielectric layer to expose the source/drain feature. A dielectric barrier layer is deposited over the workpiece and the dielectric barrier layer is recessed to expose the source/drain feature. A metal layer is then deposited over the workpiece, including on the exposed source/drain feature. After the workpiece is annealed to form a metal nitride layer from the metal layer and the dielectric barrier layer, the metal nitride layer is etched back until top surfaces of the metal nitride layer and the gate structure are coplanar. The etch back process includes use of photon-assisted implantation to implant germanium and forms a silicide layer on the second dielectric layer. A source/drain contact plug, which may include cobalt, is then formed in the source/drain contact opening. The source/drain contact plug includes a first portion extending through the first dielectric layer and a second portion extending through the etch stop layer and the second dielectric layer. Due to the etch back of the metal nitride layer, the second portion is wider than the first portion, which improves the metal fill window and relax overlay requirement when forming a contact feature over the source/drain contact plug.

The various aspects of the present disclosure will now be described in more detail with reference to the figures. In that regard, FIG. 1 is a flowchart illustrating method 100 of forming a semiconductor device according to one or more aspects of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-12, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Throughout the present disclosure, like reference numerals denote like features unless otherwise excepted.

Figure 2:
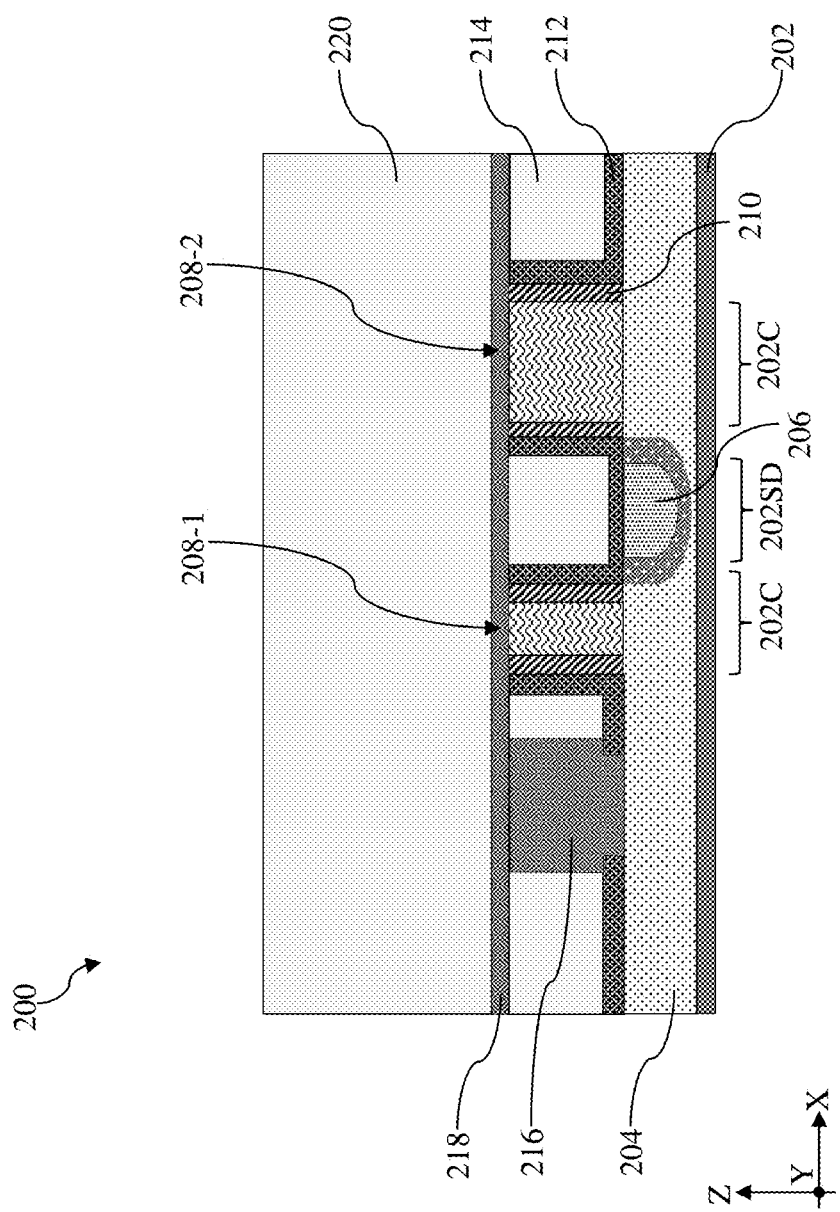
FIGS. 2-12 illustrate fragmentary cross-sectional views of a workpiece at various stages of fabrication in the method of FIG. 1, according to one or more aspects of the present disclosure.
Figure 3:
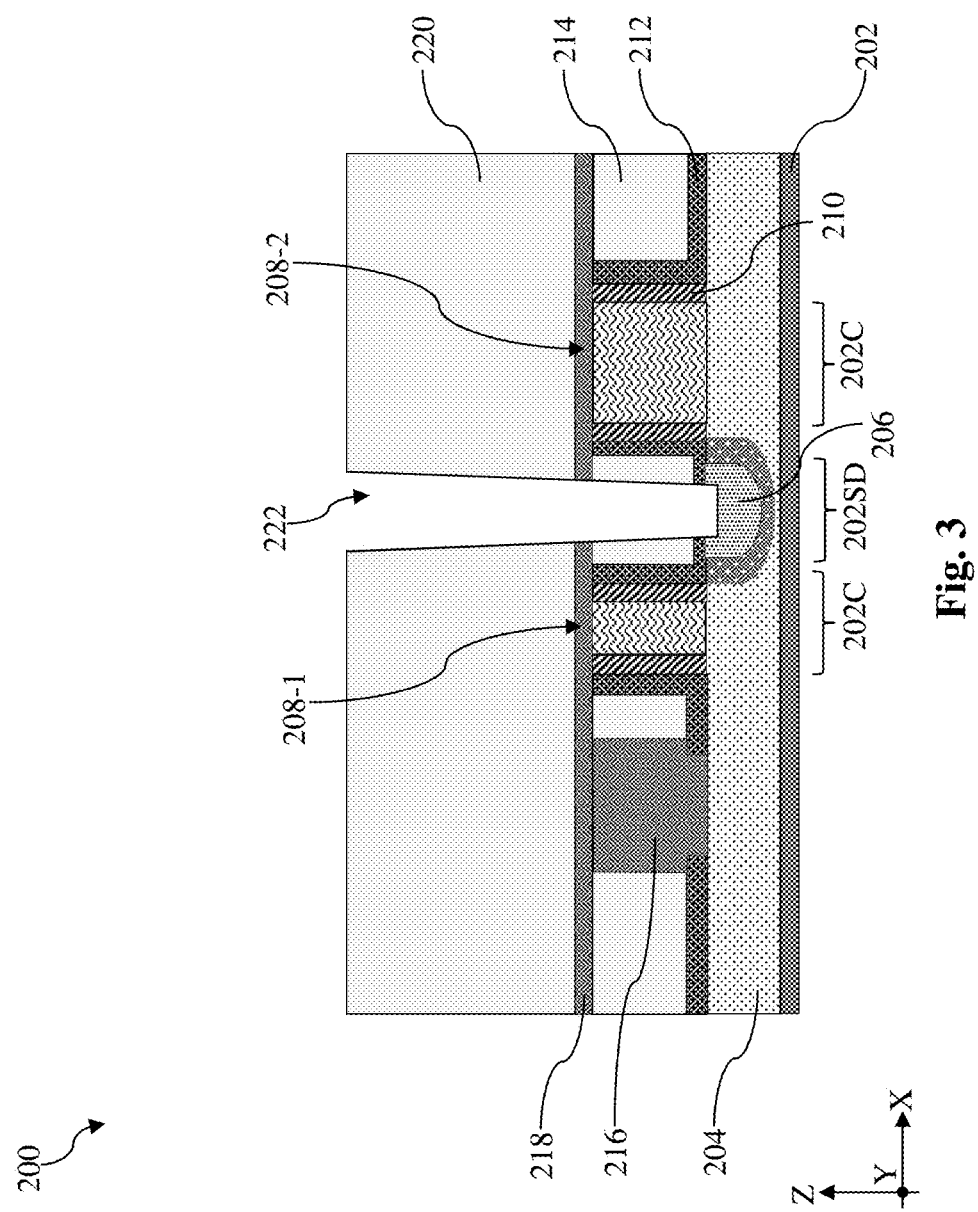

Reference is first made to FIGS. 1 and 2. Method 100 includes a block 102 where a workpiece 200 is received. As shown in FIG. 2, the workpiece 200 includes a substrate 202 and a fin structure 204 rising from the substrate 202. The workpiece 200 further includes an active region (view thereof blocked) that is isolated from adjacent active regions by an isolation structure 204. The active region extends lengthwise along the X direction and is divided into source/drain regions 202SD and channel regions 202C. One source/drain region 202SD and two channel regions 202C are shown in FIG. 2. A first gate structure 208-1 and a second gate structure 208-2 are formed over channel regions 202C of the active region as well as the isolation feature 204. A source/drain feature 206 is formed over the source/drain region 202SD of the active region and at least a portion of the source/drain feature 206 extends into the isolation feature 204, as shown in FIG. 2. A gate spacer 210 is disposed along sidewalls of the first gate structure 208-1 and the second gate structure 208-2. The workpiece 200 also includes a bottom contact etch stop layer (BCESL) 212 disposed over the source/drain feature 206 as well as sidewalls of the first gate structure 208-1 and the second gate structure 208-2. A first interlayer dielectric (ILD) layer 214 is disposed over the BCESL 212. In embodiments illustrated in FIG. 2, the workpiece 200 further includes an etch stop layer (ESL) 218 over the first ILD layer 214, the first gate structure 208-1, the second gate structure 208-2. A dielectric layer 220 is disposed over the ESL 218. In some instances, the workpiece 200 may further include a dielectric cut feature 216 that separates the active region from an adjacent active region that is aligned along the X direction.

The substrate 202 may be a silicon (Si) substrate. Alternatively or additionally, the substrate 202 may include other elementary semiconductor materials such as germanium (Ge). In some embodiments, the substrate 202 is made of a compound semiconductor such as silicon carbide, gallium arsenic, indium arsenide, or indium phosphide. In some embodiments, the substrate 202 is made of an alloy semiconductor such as silicon germanium, silicon germanium carbide, gallium arsenic phosphide, or gallium indium phosphide. In some embodiments, the substrate 202 includes one or more epitaxial layers. For example, the substrate 202 may include an epitaxial layer overlying a bulk semiconductor. In some embodiments, the substrate 202 may include a buried insulator layer, such as a buried silicon oxide layer, and may be a silicon-on-insulator (SOI) substrate.

The active region on which the first gate structure 208-1, the second gate structure 208-2 and the source/drain feature 206 resides may include one or more fin elements or a vertical stack of channel members. When the active region includes one or more fin structure, the first gate structure 208-1 and the second gate structure 208-2 are gate structures for fin-type field effect transistors (FinFETs). When the active region includes a vertical stack of channel members, the first gate structure 208-1 and the second gate structure 208-2 are gate structures for multi-bridge-channel (MBC) transistors. FinFETs and MBC transistors are examples of multi-gate devices, which have been introduced to improve gate control by increasing gate-channel coupling, reducing off-state current, and reducing short-channel effects (SCEs). With respect to the MBC transistors, because its gate structure surrounds the channel regions, an MBC transistor may also be referred to as a surrounding gate transistor (SGT) or a gate-all-around (GAA) transistor. Channel members of an MBC transistor may come in shapes of nanowires, nanosheets, or other nanostructures. The shapes of the channel members have also given an MBC transistor alternative names such as a nanosheet transistor or a nanowire transistor. The active region may be patterned from the substrate 202 but epitaxial layers deposited on the substrate 20. The active region may include silicon (Si), silicon germanium (SiGe), germanium (Ge), or III-V semiconductor materials such as gallium arsenic, indium arsenide, or indium phosphide.

The isolation feature 204 may also be referred to as a shallow trench isolation (STI) feature 204. In some embodiments, the isolation feature 204 may include silicon oxide, silicon nitride, silicon oxynitride, fluorine-doped silicate glass (FSG), a low-k dielectric, combinations thereof, and/or other suitable materials. Depending on the conductivity type of the semiconductor device 200, the source/drain feature 206 may be either n-type or p-type. When the source/drain feature 206 is n-type, it may include phosphorus-doped silicon (Si:P), arsenic-doped silicon (Si:As), or antimony-doped silicon (Si:Sb). When the source/drain feature 206 is p-type, it may include boron-doped silicon germanium (SiGe:B) or gallium-doped silicon germanium (SiGe:Ga). The source/drain feature 206 may be formed using vapor phase epitaxy (VPE) or molecular bean epitaxy (MBE) and may be referred to as an epitaxial feature. In some embodiments, the source/drain feature 206 may include more than one layer. For example, as shown in FIG. 2, the source/drain feature 206 may include an outer epitaxial layer and an inner epitaxial layer and the inner epitaxial layer is more heavily doped than the outer epitaxial layer to reduce resistance.

While not explicitly shown, each of the first gate structure 208-1 and the second gate structure 208-2 may include a gate dielectric layer and a gate electrode. The gate dielectric layer may include an interfacial layer disposed on the active region and a high-K dielectric layer disposed over the interfacial layer. Here, a high-k dielectric material refers to a dielectric material having a dielectric constant greater than that of silicon dioxide, which is about 3.9. In some embodiments, the interfacial layer includes silicon oxide and silicon hafnate. The high-k dielectric layer may include hafnium oxide ($HfO_2$). Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), $(Ba,Sr)TiO_3$ (BST), silicon nitride (SiN), silicon oxynitride (SiON), combinations thereof, or other suitable material. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The gate spacer 210 may include silicon oxide, silicon nitride, silicon carbide, silicon oxynitride, silicon carbonitride, silicon oxycarbide, silicon oxycarbonitride, and/or combinations thereof. The BCESL 212 and the ESL 218 may include silicon nitride. The first ILD layer 214 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric cut feature 216 may be formed of silicon nitride or a metal oxide material. Example metal oxide materials may include aluminum oxide, zirconium oxide, or hafnium oxide. The dielectric layer 220 may include silicon oxide. In one embodiment, the dielectric layer 220 may be formed of silicon oxide using plasma-enhanced chemical vapor deposition (PECVD) and such silicon oxide may be referred to as plasma-enhanced oxide (PEOX). In some embodiments, the BCESL 212 has a thickness along the Z direction between about 2 nm and about 4 nm; the ESL 218 has a thickness along the Z direction between about 2 nm and about 4 nm; the first ILD layer 214 has a thickness along the Z direction between about 8 nm and about 10 nm Referring to FIGS. 1 and 3, method 100 includes a block 104 where a source/drain contact opening 222 is formed. The source/drain contact opening 222 may be formed using a combination of photolithography and etch processes. In an example process, a hard mask is deposited over the workpiece 200. A photoresist layer is then deposited over the hard mask layer. The photoresist layer is exposed to radiation reflected from or transmitting through a photomask, performing post-exposure bake processes, and developing the photoresist layer to form a masking element including the photoresist layer. The masking element may then be used as an etch mask to pattern the hard mask and the patterned hard mask is applied as an etch mask to etch the dielectric layer 220, the ESL 218, the first ILD layer 214, and the BCESL 212 to form the source/drain contact opening 222 to expose the source/drain feature 206. In some implementations, the etch process to form the source/drain contact opening 222 may be a dry etch process or a reactive-ion-etching (ME). Example dry etch process may include an oxygen-containing gas, hydrogen, a fluorine-containing gas (e.g., $CF_4$, $SF_6$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $C_{12}$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 3, the source/drain contact opening 222 may extend partially into the source/drain feature 206.

Figure 4:
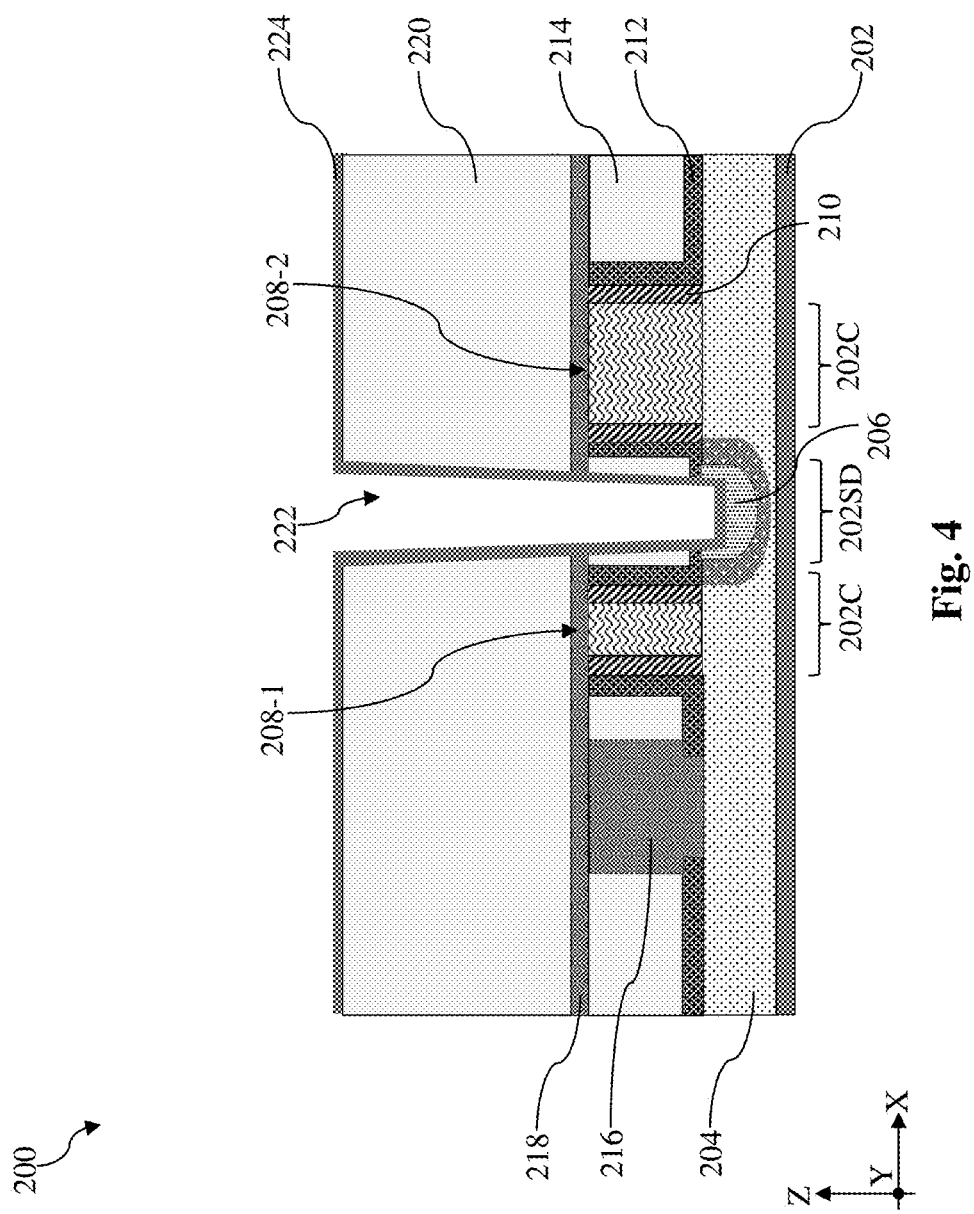

Referring to FIGS. 1 and 4, method 100 includes a block 106 where a dielectric barrier layer 224 is deposited over the workpiece 200. In some embodiments, the dielectric barrier layer 224 may include silicon nitride. In some implementations, the dielectric barrier layer 224 may be deposited using CVD, plasma-enhanced CVD (PECVD), low-pressure CVD (LPCVD), subatmospheric CVD (SACVD), or atomic layer deposition (ALD). In some implementations, dielectric barrier layer 224 may be conformally deposited in the source/drain contact opening 222 such that it extends along the sidewalls of the source/drain contact opening 222. As shown in FIG. 4, the dielectric barrier layer 224 may be deposited over top surfaces of the dielectric layer 220, sidewalls of the dielectric layer 220, sidewalls of the ESL 218, sidewalls of the first ILD layer 214, as well as sidewalls of the BCESL 212. In FIG. 4, the dielectric barrier layer 224 is deposited over and covers the source/drain feature 206. In some instances, the dielectric barrier layer 224 may be deposited to a thickness between about 3 nm and about 4 nm.

Figure 5:
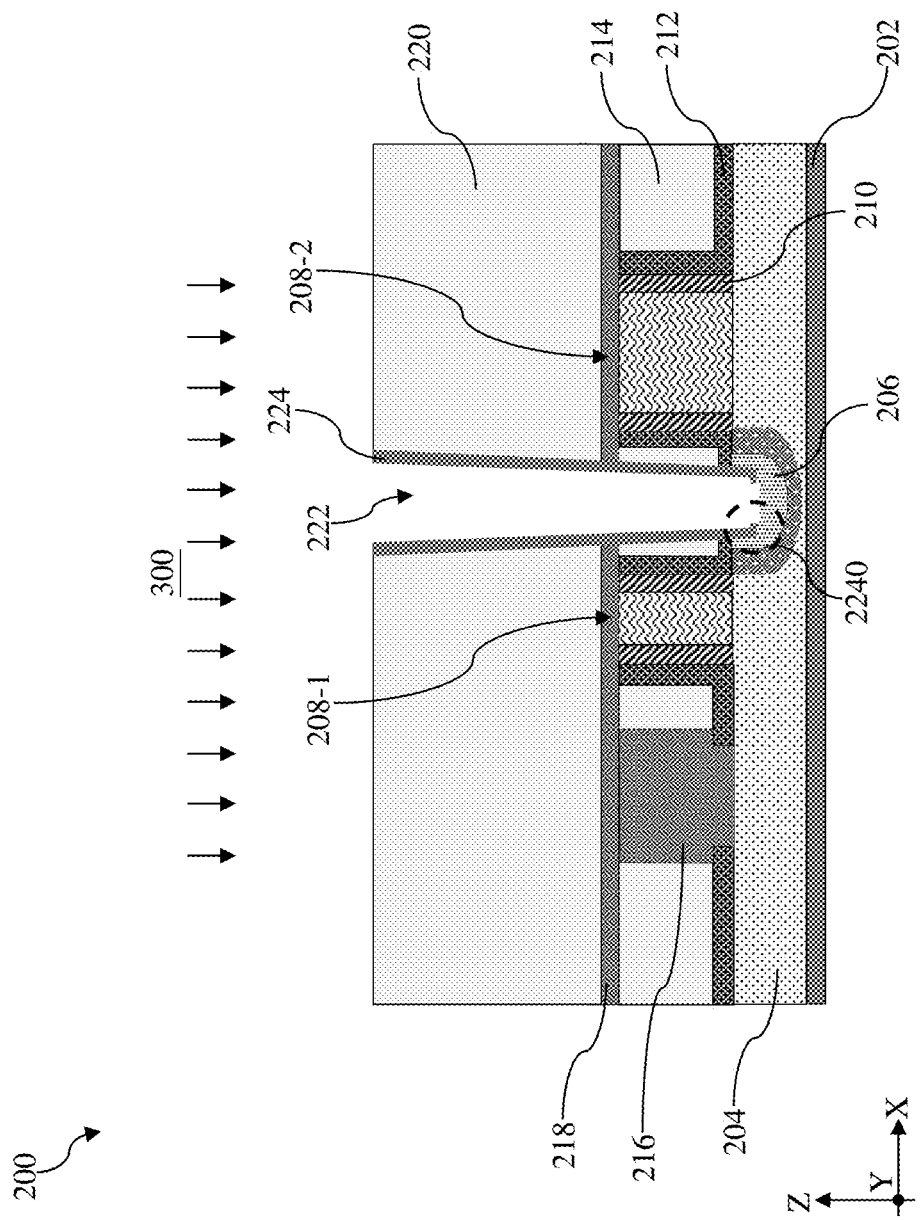

Referring to FIGS. 1 and 5, method 100 includes a block 108 where the dielectric barrier layer 224 is recessed to expose the source/drain feature 206. In some embodiments, the workpiece 200 is subject to an anisotropic etch process 300 at block 108 to remove the dielectric barrier layer 224 deposited on the source/drain feature 206. As shown in FIG. 5, upon conclusion of the operations at block 108, at least a portion of the source/drain feature 206 is exposed in the source/drain contact opening 222. In some implementations, the anisotropic etch process 300 may include a reactive ion etching (RIE) process that uses hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the recessing at block 108, the dielectric barrier layer 224 may remain disposed along sidewalls of the dielectric layer 220, sidewalls of the ESL 218, sidewalls of the first ILD layer 214, as well as sidewalls of the BCESL 212. In some embodiment illustrated in FIG. 5, a bottom corner portion 2240 of the dielectric barrier layer 224 may survive the anisotropic etch process 300. The bottom corner portion 2240 may cover a portion of the source/drain feature 206.

Referring still to FIGS. 1 and 5, method 100 includes a block 110 where the exposed source/drain feature 206 is implanted with a dopant. In some embodiments, an implantation process 300 may be performed at block 110 to implant germanium (Ge) into the exposed source/drain feature 206. In some implementations where the source/drain feature 206 is p-type, the source/drain feature 206 may have uneven germanium distribution due to germanium aggregation, which may result in unsatisfactory silicide formation thereon in a later process. The germanium (Ge) implantation at block 110 may help provide a uniform germanium distribution on the exposed surface of the p-type source/drain features 206, which facilitate satisfactory silicide formation. In some embodiments, the implantation process 300 may be a photon-assisted implantation (PAI). To ensure that the germanium is directed to the source/drain feature 206 down the source/drain contact opening 222, the implantation process 300 may have a small (i.e., steep) implantation angle. The germanium implantation process 300 may also be referred to as a pre-silicide implantation process.

Figure 6:
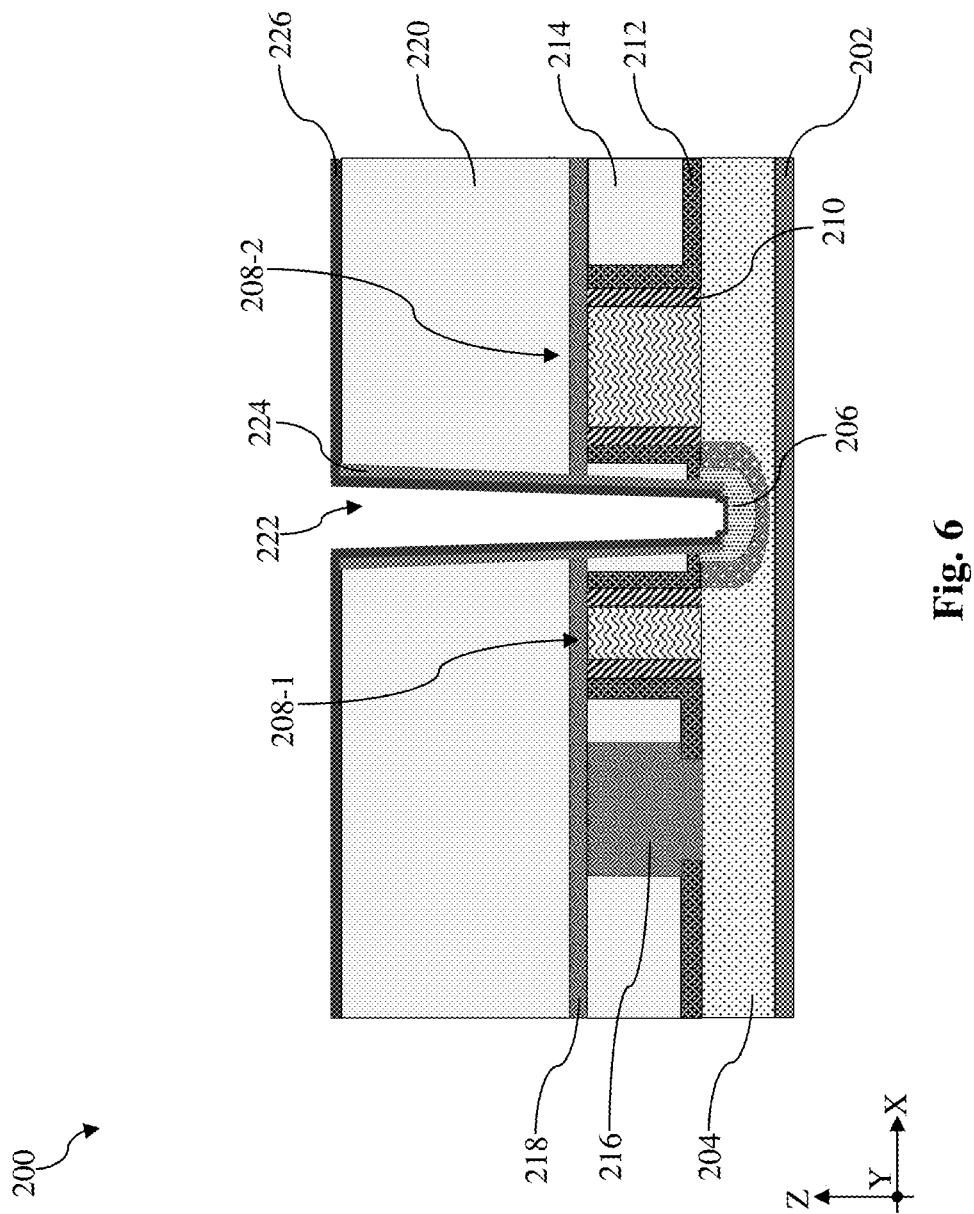

Referring to FIGS. 1 and 6, method 100 includes a block 112 where a first metal liner 226 is deposited over the workpiece 200. The first metal liner 226 may include titanium (Ti), tantalum (Ta), nickel (Ni), cobalt (Co), or tungsten (W). In one embodiment, the first metal liner 226 includes titanium (Ti). Because the first metal liner 226 will react with other layer to form silicide layers or metal nitride layers, the first metal liner 226 may also be referred to as a metal precursor layer. In some implementations, the first metal liner 226 may be deposited using physical vapor deposition (PVD), atomic layer deposition (ALD), plasma-enhanced ALD (PEALD), or metalorganic chemical vapor deposition (MOCVD).

Figure 7:
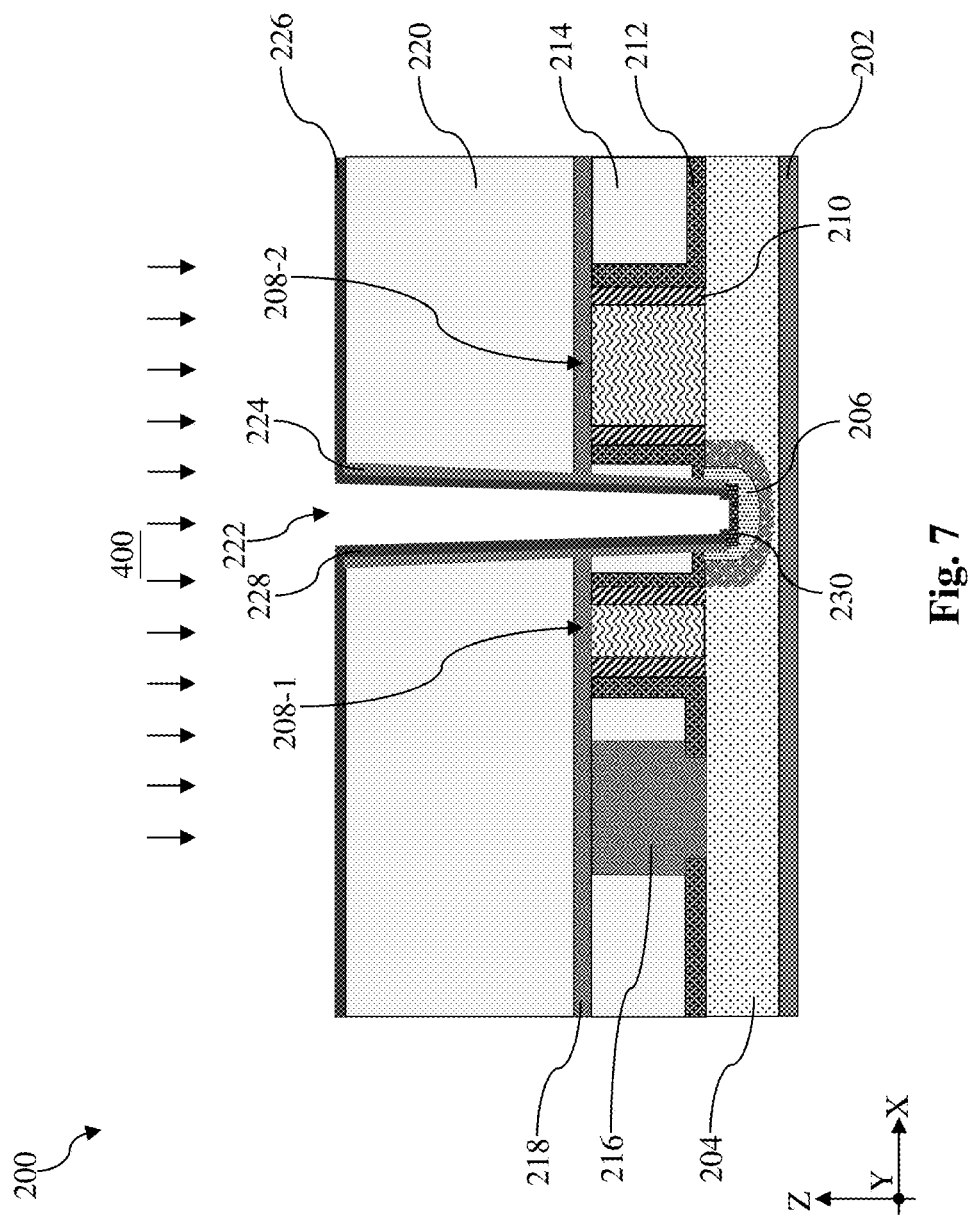

Referring to FIGS. 1 and 7, method 100 includes a block 114 where an anneal process 400 is performed to form a second metal liner 228 and a silicide feature 230. In some embodiments, the anneal process 400 at block 112 may be a rapid thermal anneal (RTA) process, a laser anneal process, a spike anneal process, or a millisecond anneal (MSA) process. In some instances, the anneal process 400 may include an anneal temperature or a peak anneal temperature between about 200° C. and about 500° C. The anneal process 400 may bring about or accelerate the reaction between the first metal liner 226 and the dielectric barrier layer 224 as well as between the first metal liner 226 and the exposed source/drain feature 206. As shown in FIG. 7, facilitated by the anneal process 400, the first metal liner 226 and the dielectric barrier layer 224 may react to form a second metal liner 228. The second metal liner 228 may include the metal in the first metal liner 226 and nitrogen atoms from the dielectric barrier layer 224. For example, when the first metal liner 226 includes titanium and the dielectric barrier layer 224 includes silicon nitride, titanium in the first metal liner 226 may be at least partially nitridated to form titanium nitride (TiN). Because the nitridation may be complete, the second metal liner 228 may include both the metal of the first metal liner 226 and the metal nitride form from the nitridation. That is, in this example, the second metal liner 228 may include both titanium (Ti) and titanium nitride (TiN). At the same time, the first metal liner 226 that is in contact with the source/drain feature 206 may undergo silicidation reaction brought about or accelerated by the anneal process 400. For example, when the first metal liner 226 includes titanium and the source/drain feature 206 includes silicon, titanium in the first metal liner 226 may undergo silicidation reaction to form the silicide feature 230 at the interface between the first metal liner 226 and the source/drain feature 206. In this example, the silicide feature 230 may include titanium silicide. Depending on the composition of the first metal liner 226, the second metal liner 228 may also include a mixture of tantalum (Ta) and tantalum nitride (TaN), a mixture of cobalt (Co) and cobalt nitride (CoN), a mixture of nickel (Ni) and nickel nitride (NiN), or a mixture of tungsten (W) and tungsten nitride (WN). The silicide feature 230 may also include tantalum silicide, cobalt silicide, nickel silicide, or tungsten silicide. While not explicitly shown in FIG. 7, the anneal process 400 may also cause the metal in the second metal liner 228 to react with silicon in the dielectric layer 220 to form metal silicide that may precipitate near the boundary between the dielectric barrier layer 224 and the dielectric layer 220. This precipitation of metal silicide may be exposed during block 116 as a third metal liner 232.

Figure 8:
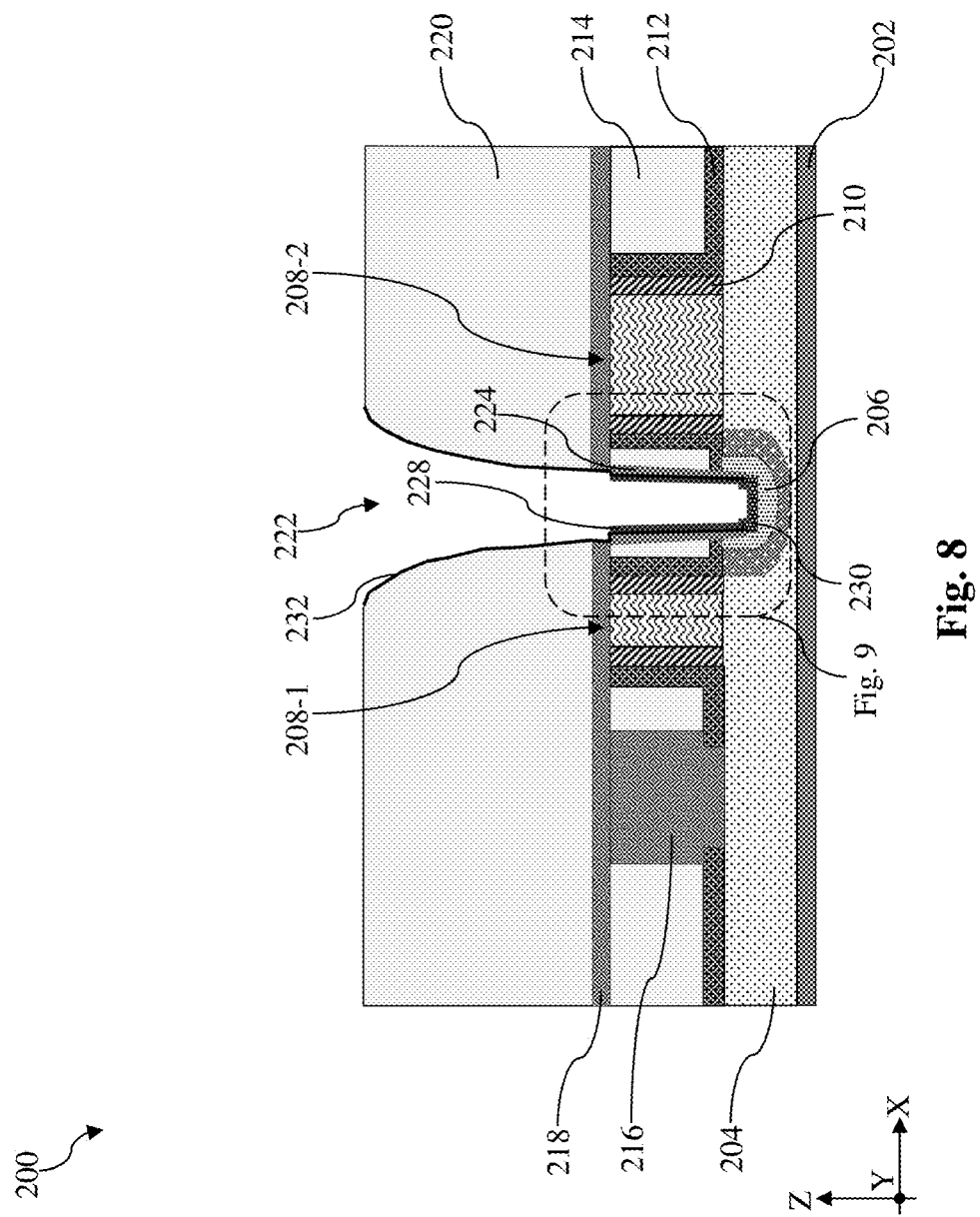
Figure 9:
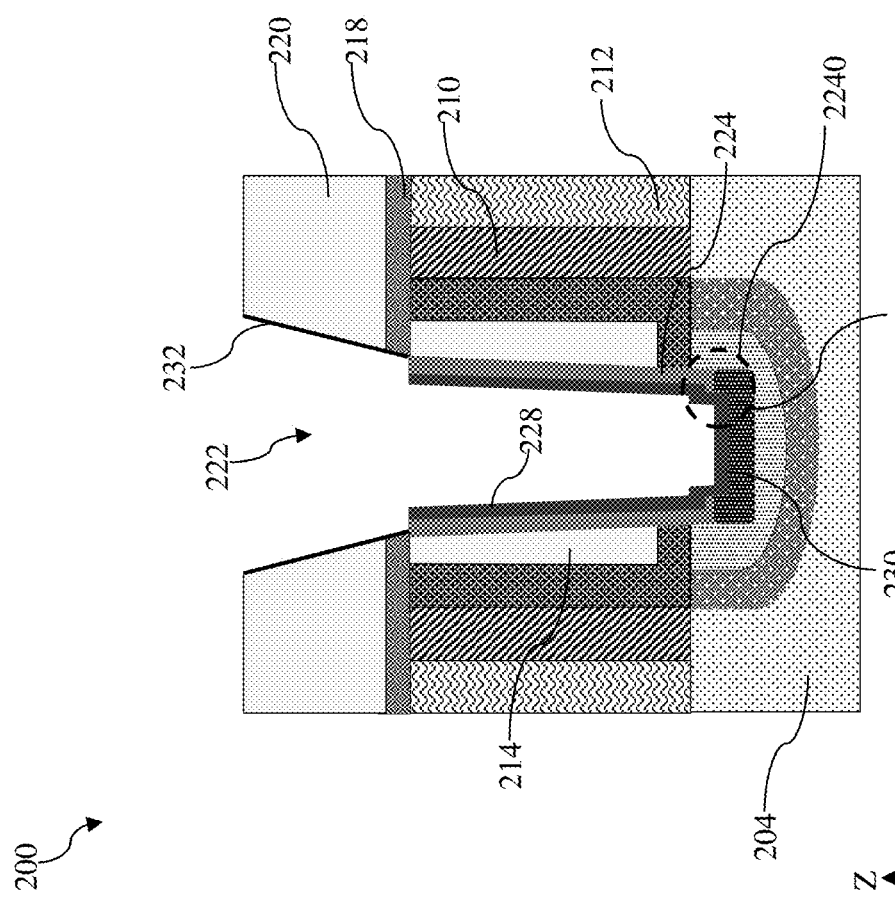

Referring to FIGS. 1, 8 and 9, method 100 includes a block 116 where the second metal liner 228 is etched back. In some embodiments, the second metal liner 228 and the dielectric barrier layer 224 are etched backed using an etch back process. In some implementations, the etch back process may be anisotropic and may include a reactive ion etching (RIE) process that uses hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 8, the etch back process etches the second metal liner 228 and the dielectric barrier layer 224 until top surfaces of the second metal liner 228 are substantially coplanar with top surfaces of the first gate structure 208-1, the second gate structure 208-2, and the first ILD layer 214. As shown in FIG. 8, as the etch back process may substantially remove the first metal liner 228 and the dielectric barrier layer 224 from surfaces of the dielectric layer 220 and the ESL 218, a third metal liner 232 that is precipitated and formed at block 114 may become exposed. The third metal liner 232 may include metal silicide and may have a composition similar to the silicide feature 230. In one embodiment, the third metal liner 232 may include titanium silicide. In some other embodiments, the third metal liner 232 may include tantalum silicide, cobalt silicide, nickel silicide, or tungsten silicide.

The dotted area in FIG. 8 is enlarged and shown in FIG. 9. Because the etch back process removes the second metal liner 228 and the dielectric barrier layer 224 from the sidewalls of the dielectric layer 220 and the ESL 218, the source/drain contact opening 222 in FIG. 9 includes a width-wise step change at the level of the interface between the first ILD layer 214 and the ESL 218. That is, a width of the source/drain contact opening 222 may undergo a sudden change near or around the level of the interface between the first ILD layer 214 and the ESL 218. Additionally, because the presence of the bottom corner portion 2240 and the second metal liner 228 disposed over the bottom corner portion 2240, the source/drain contact opening 222 also includes a width-wise step change adjacent the bottom corner portion 2240.

Figure 10:
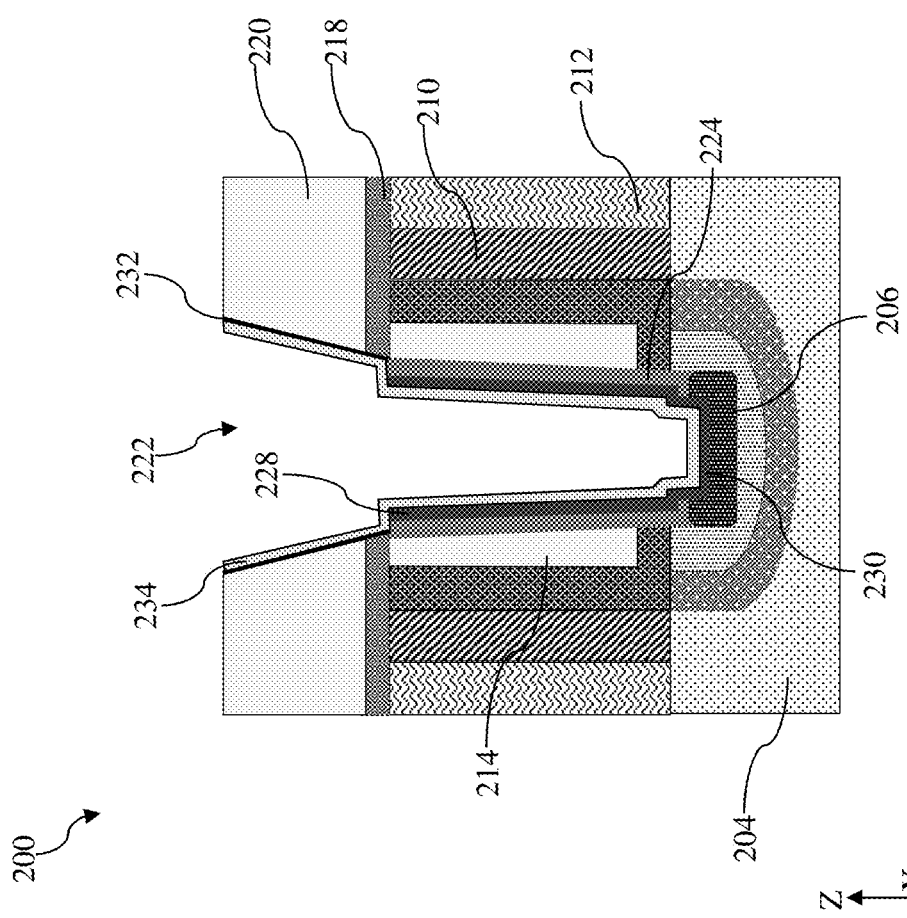

Referring to FIGS. 1 and 10, method 100 includes a block 118 where a first metal layer 234 is deposited in the source/drain contact opening 222. The first metal layer 234 constitutes an outer perimeter of a contact plug 240 (shown in FIG. 11) and an interface with the first dielectric layer 220, the ESL 218, the second metal liner 228, and the dielectric barrier layer 224. In some embodiments, the first metal layer 234 may include cobalt (Co) and may be deposited using atomic layer deposition (ALD) or plasma-enhanced ALD (PEALD). Example precursors used at block 116 for cobalt (Co) deposition may include bis(ethylcyclopentadienyl) cobalt (i.e., Cobaltocene). Although the ALD or PEALD deposition allows first metal layer 234 to be conformal, it is slow and may increase process time and cost. Therefore, in some implementations, the first metal layer 234 is only formed to a thickness between about 1 nm and about 2 nm and the rest of the contact plug 240 is deposited using a deposition method with greater deposition rate. In some alternative embodiments, the first metal layer 234 may include other metals, such as ruthenium (Ru), nickel (Ni), molybdenum (Mo), or tungsten (W). As shown in FIG. 10, because the first metal layer 234 lines the outer perimeter of the contact plug, it may be referred to as an aura metal layer or an aura layer.

Figure 11:
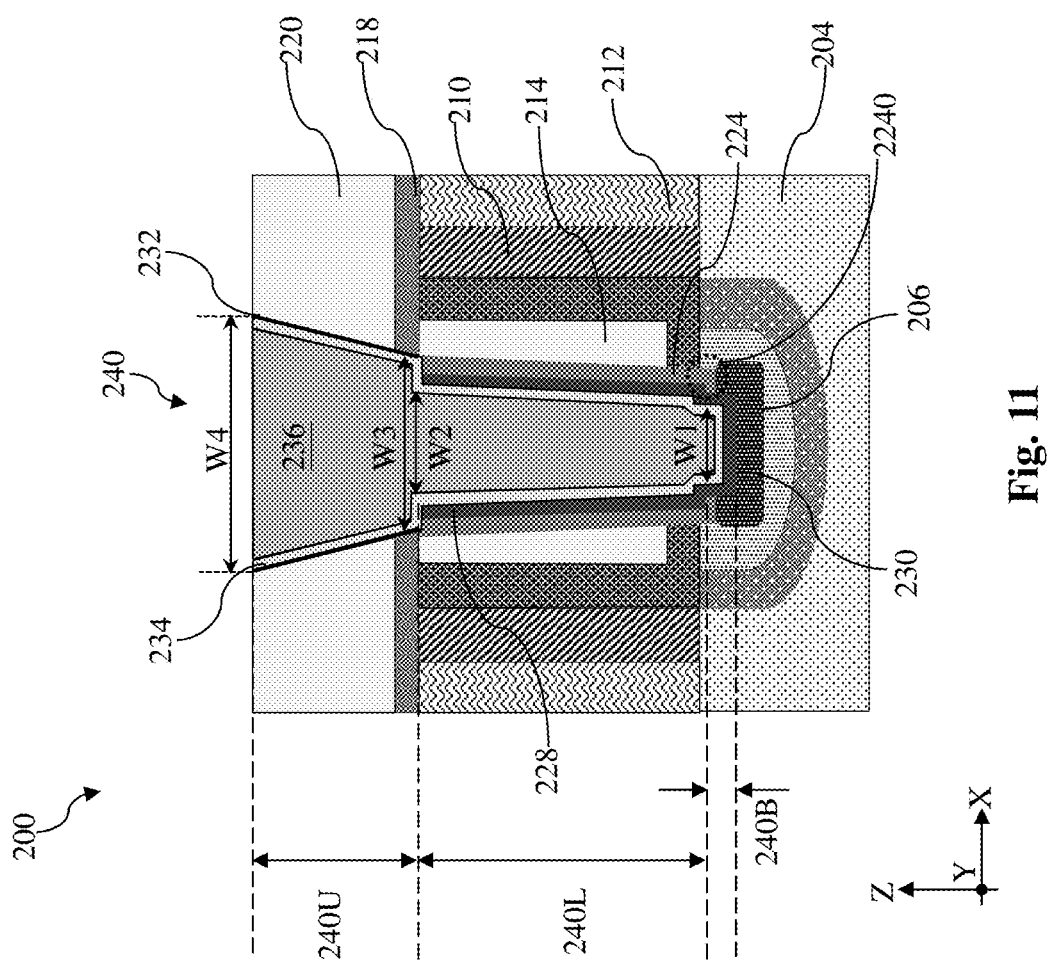

Referring to FIGS. 1 and 11, method 100 includes a block 120 where a second metal layer 236 is deposited over the first metal layer 234. The second metal layer 236 constitutes the metal fill layer of a contact plug 240. In some embodiments, the second metal layer 236 may include cobalt (Co) and may be deposited using CVD, plasma-enhanced CVD (PECVD, or metalorganic CVD (MOCVD). In these embodiments, a composition of the first metal layer 234 and a composition of the second metal layer 236 may be substantially the same. In alternative embodiments, the second metal layer 236 may include other metals, such as copper (Cu), ruthenium (Ru), nickel (Ni), molybdenum (Mo), or tungsten (W). The second metal layer is spaced apart from the first dielectric layer 220, the ESL 218, the second metal liner 228, and the dielectric barrier layer 224 by the first metal layer 234. After the deposition of the second metal layer 236, a planarization process, such as a chemical mechanical polishing (CMP) process is performed to remove excess materials, such as excess first metal layer 234 or excess second metal layer 236. As shown in FIG. 11, the planarization process removes materials over the dielectric layer 220 and even a surface portion of the dielectric layer 220 such that top surfaces of the second metal layer 236 and the dielectric layer 220 are coplanar. At this point, the contact plug 240 is substantially formed in the source/drain contact opening 222 (shown in FIG. 10).

Because the source/drain contact opening 222 in FIG. 9 includes step-wise width changes, the contact plug in FIG. 11 also include step-wise width changes. Referring to FIG. 11, the contact plug 240 includes a bottom portion 240B, a lower portion 240L over the bottom portion 240B, and an upper portion 240U over the lower portion 240L. The bottom portion 240B refers to the portion of the contact plug 240 below the top surface of the corner portion 2240. The lower portion 240L refers to the portion of the contact plug 240 between the top surface of the corner portion 2240 and the top surface of the first ILD layer 214. The upper portion 240U refers to the portion of the contact plug above the top surface of the first ILD layer 214. The bottom portion 240B has a first width (W1) along the X direction, a top surface of the lower portion 240L has a second width (W2) along the X direction, a bottom surface of the upper portion 240U has a third width (W3) along the X direction, and a top surface of the upper portion 240U has a fourth width (W4) along the X direction. The fourth width (W4) is greater than the third width (W3), the third width (W3) is greater than the second width (W2), and the second width (W2) is greater than the first width (W1). In some instances, the first width (W1) may be between about 12 nm and about 14 nm, the second width (W2) is between about 13 nm and about 15 nm, the third width (W3) is between about 14 nm and about 16 nm, and the fourth width (W4) is between about 15 nm and about 17 nm. The step-wise width change may be observed at the junction between the lower portion 240L and the upper portion 240U. Although the lower portion 240L and the upper portion 240U are continuous, the change from the second width W2 to third width W3 is discontinuous and abrupt. This is due to the etch back of the dielectric barrier layer 224 and the second metal liner 228 at block 114. A bottom portion of the second metal liner 228 extends downward through the dielectric barrier layer 224 and the bottom portion 240B of the contact plug 240 extends into the bottom portion of the second metal liner 228. Along the Z direction, the silicide feature 230 has a thickness between about 4 nm and about 5 nm.

Figure 12:
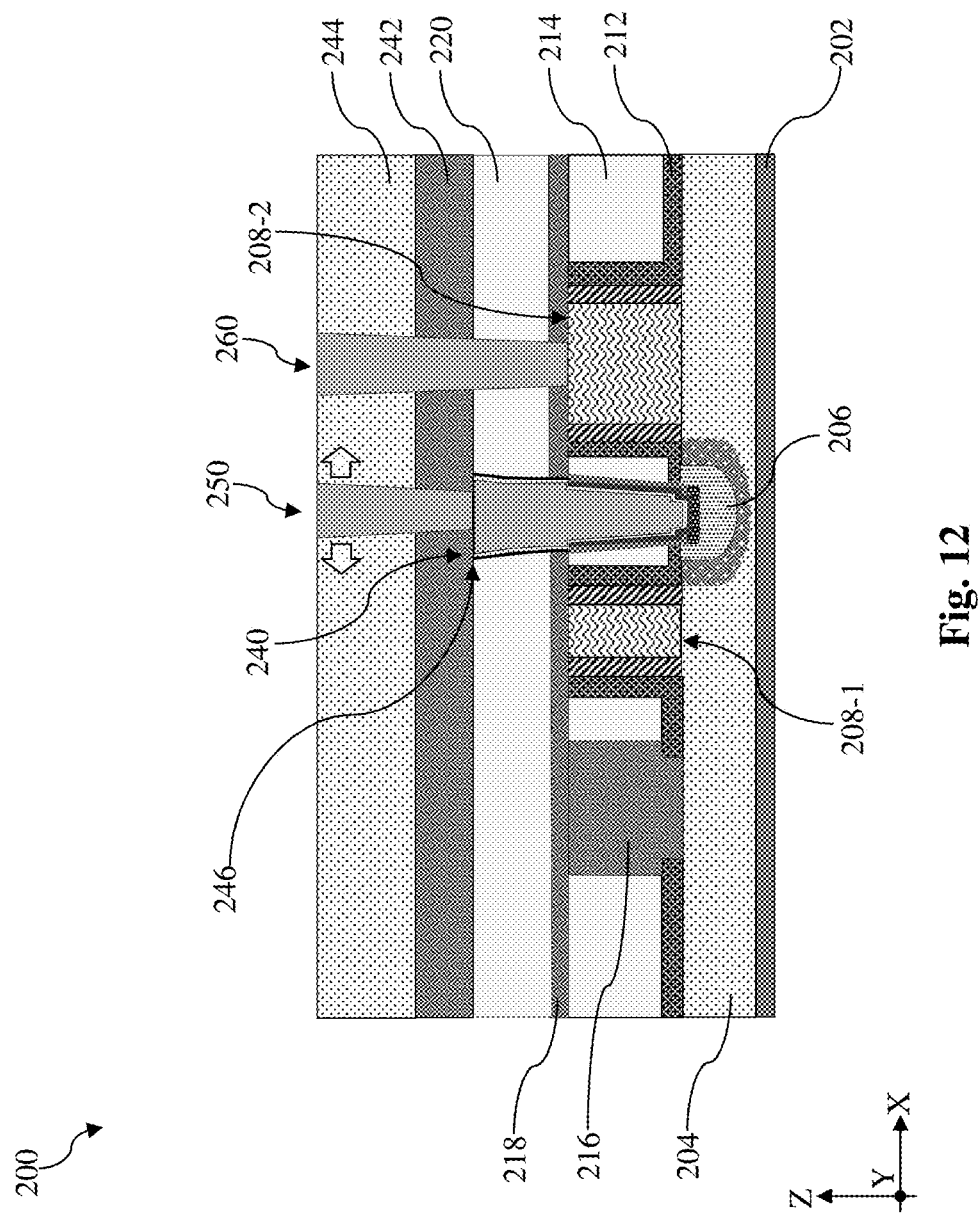

Referring to FIGS. 1 and 12, method 100 includes a block 122 where further processes are performed. Such further processes may include formation of a top silicide layer 246, deposition of a middle contact etch stop layer (MCESL) 242, deposition of a second ILD layer 244, formation of a source/drain contact via 250, and formation of a gate contact via 260. The MCESL 242 may include silicon nitride, silicon carbonitride, or silicon oxycarbide and may be deposited using CVD, PECVD, or ALD. In one embodiment, the MCESL 242 includes silicon nitride. The silicon precursor of the MCESL 242 deposition process may react with the contact plug 240 and forms a top silicide layer 246 on the top surface of the contact plug 240. In one embodiment, the top silicide layer 246 may include cobalt silicide. The composition and deposition of the second ILD layer 244 may be similar to those of the first ILD layer 214. In some embodiments, the second ILD layer 244 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some implementations, the second ILD layer 244 may be deposited using spin-on coating, CVD, flowable CVD (FCVD), PECVD, or a suitable deposition method. A source/drain contact via opening is then formed through the second ILD layer 244 and the MCESL 242 to expose the top silicide layer 246 or the contact plug 240. In the same process or in a separate process, a gate contact via opening is formed through the second ILD layer 244, the MCESL 242, and the dielectric layer 220 to expose the second gate structure 208-2. In some embodiments, a reactive-ion-etching (ME) may be used to form the source/drain contact via opening and the gate contact via opening. Such an RIE process may include a plasma having an oxygen-containing gas, hydrogen, a fluorine-containing gas (e.g., $CF_4$, $SF_6$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After a pre-clean process to remove debris and contaminants over the contact plug 240 and the second gate structure 208-2, the source/drain contact via 250 and the gate contact via 260 are then formed in the source/drain contact via opening and the gate contact via opening, respectively. In some implementations, the source/drain contact via 250 and the gate contact via 260 may include tungsten and may be deposited using PVD or electrodeless plating.

Some of the benefits of embodiments of the present disclosure are apparent in view of FIG. 12. Due to the etch back process at block 116, the width of the upper portion 240U (shown in FIG. 11) is wider and without the second metal liner 228, which is less conductive than the contact plug 240. As such, the methods and structures of the present disclosure reduce the contact resistance and improve the process tolerance. Even when the overlay is less than ideal (shown by the arrows along X direction), the chance of the source/drain contact via 250 to miss the contact plug 240 completely or land on the second metal liner 228 (or dielectric barrier layer 224) is reduced.

One aspect of the present disclosure pertains to a semiconductor device. The semiconductor device includes a gate structure, a source/drain feature adjacent the gate structure, a first dielectric layer over the source/drain feature, an etch stop layer over the gate structure and the first dielectric layer, a second dielectric layer over the etch stop layer, a source/drain contact including a first portion extending through the first dielectric layer and a second portion extending through the etch stop layer and the second dielectric layer, a metal silicide layer disposed between the second portion and etch stop layer, and a metal nitride layer disposed between the first portion and the first dielectric layer.

In some embodiments, the metal nitride layer includes titanium nitride. In some instances, the metal silicide layer includes titanium silicide. In some implementations, the source/drain contact includes cobalt. In some implementations, the source/drain contact consists essentially of cobalt. In some embodiments, the semiconductor device may further include a dielectric barrier layer sandwiched between the metal nitride layer and the first dielectric layer. In some embodiments, the dielectric barrier layer includes silicon nitride. In some embodiments, the metal silicide layer is in direct contact with the second portion of the source/drain contact. In some embodiments, the first portion includes a top width, the second portion includes a bottom width, and the bottom width of the second portion is greater than the top width of the first portion.

Another one aspect of the present disclosure pertains to a semiconductor structure. The semiconductor structure includes a source/drain feature, a first dielectric layer over the source/drain feature, a second dielectric layer over the first dielectric layer, a source/drain contact including a first portion extending through the first dielectric layer and a second portion extending through the second dielectric layer, a conductive barrier layer disposed between the first portion and the first dielectric layer, a dielectric barrier layer disposed between the conductive barrier layer and the first dielectric layer, and a metal silicide layer disposed between and in contact with the second dielectric layer and the second portion. In some embodiments, the source/drain contact includes a step width change between the first portion and the second portion. In some instances, the semiconductor structure may further include a silicide feature disposed between the source/drain contact and the source/drain feature. In some embodiments, an end portion of the conductive barrier layer extends through the dielectric barrier layer and into the silicide feature. In some embodiments, the source/drain contact further includes a bottom portion disposed below the first portion and the bottom portion of the source/drain contact extends into the end portion of the conductive barrier layer. In some instances, the first dielectric layer and the second dielectric layer include silicon oxide, wherein the metal silicide layer includes titanium silicide, the dielectric barrier layer includes silicon nitride, the conductive barrier layer includes titanium nitride, and the source/drain contact includes cobalt. In some implementations, the semiconductor structure may further include an etch stop layer disposed between the first dielectric layer and the second dielectric layer.

Yet another aspect of the present disclosure pertains to a method. The method includes receiving a workpiece that includes a gate structure, a source/drain feature adjacent the gate structure, a bottom etch stop layer over the source/drain feature, a first dielectric layer over the bottom etch stop layer, and a second dielectric layer over the first dielectric layer. The method may further include forming a source/drain contact opening through the bottom etch stop layer, the first dielectric layer and the second dielectric layer to expose the source/drain feature, conformally depositing a dielectric barrier layer over the workpiece; recessing the dielectric barrier layer to expose top-facing surfaces of the workpiece, after the recessing of the dielectric barrier layer, conformally depositing a metal layer over the workpiece, after the conformally depositing of the metal layer, performing an anneal process to the workpiece to form a metal nitride layer, etching back the metal nitride layer, and after the etching back, forming a contact plug over the metal nitride layer.

In some embodiments, the method may further include after the recessing of the dielectric barrier layer, implanting the workpiece with germanium. In some embodiments, the implanting includes a photon-assisted implantation process. In some embodiments, the etching back of the metal nitride layer includes etching the metal nitride layer until a top surface of the metal nitride layer is substantially coplanar with a top surface of the gate structure. In some instances, the etching back of the metal nitride layer includes forming a metal silicide layer over a surface of the second dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor structure, comprising:
a source/drain feature;
a first etch stop layer over the source/drain feature;
a first dielectric layer over the first etch stop layer;
a second etch stop layer over the first dielectric layer and the first etch stop layer;
a second dielectric layer over the second etch stop layer;
a source/drain contact comprising:
   a lower portion extending through the first etch stop layer and the first dielectric layer, and
   an upper portion disposed on the lower portion, the upper portion extending through the second etch stop layer and the second dielectric layer;
a first metal liner disposed between the lower portion and the first dielectric layer;
a dielectric barrier layer extending between the first metal liner and the first dielectric layer as well as between the first metal liner and the first etch stop layer; and
a second metal liner disposed between the upper portion and the second dielectric layer, wherein a composition of the first metal liner is different from a composition of the second metal liner.

2. The semiconductor structure of claim 1, wherein the first metal liner comprises tantalum (Ta) and tantalum nitride (TaN), a mixture of cobalt (Co) and cobalt nitride (CON), a mixture of nickel (Ni) and nickel nitride (NiN), or a mixture of tungsten (W) and tungsten nitride (WN),
wherein the second metal liner comprises tantalum silicide, cobalt silicide, nickel silicide, or tungsten silicide.

3. The semiconductor structure of claim 1, wherein the source/drain contact comprises:
a first metal layer in direct contact with the first metal liner and the second metal liner; and
a second metal layer spaced apart from the first metal liner and the second metal liner by the first metal layer.

4. The semiconductor structure of claim 3,
wherein the first metal layer comprises ruthenium (Ru), nickel (Ni), molybdenum (Mo), or tungsten (W),
wherein the second metal layer comprises copper (Cu), ruthenium (Ru), nickel (Ni), molybdenum (Mo), or tungsten (W).

5. The semiconductor structure of claim 1, further comprising:
a silicide feature disclosed between the lower portion and the source/drain feature.

6. The semiconductor structure of claim 5, wherein the silicide feature comprises titanium silicide, tantalum silicide, cobalt silicide, nickel silicide, or tungsten silicide.

7. The semiconductor structure of claim 1,
wherein the lower portion tapers toward the source/drain feature,
wherein the upper portion tapers toward the lower portion.

8. The semiconductor structure of claim 1, wherein a bottom width of the upper portion is greater than a top width of the lower portion.

9. A semiconductor structure, comprising:
an active region having a source/drain region sandwiched between a first channel region and a second channel region;
a source/drain feature over the source/drain region;
a first gate structure over the first channel region;
a second gate structure over the second channel region;
a first etch stop layer extending along a sidewall of the first gate structure, over the source/drain feature, and along a sidewall of the second gate structure;
a first dielectric layer over the first etch stop layer;
a second etch stop layer over the first dielectric layer, the first etch stop layer, the first gate structure, and the second gate structure
a second dielectric layer over the second etch stop layer;
a source/drain contact comprising:
a lower portion extending through the first etch stop layer and the first dielectric layer, and
an upper portion disposed on the lower portion, the upper portion extending through the second etch stop layer and the second dielectric layer;
a first metal liner disposed between the lower portion and the first dielectric layer;
a dielectric barrier layer extending between the first metal liner and the first dielectric layer as well as between the first metal liner and the first etch stop layer; and
a second metal liner disposed between the upper portion and the second dielectric layer,
wherein the first metal liner comprises tantalum and tantalum nitride, a mixture of cobalt and cobalt nitride, a mixture of nickel and nickel nitride, or a mixture of tungsten and tungsten nitride,
wherein the second metal liner comprises tantalum silicide, cobalt silicide, nickel silicide, or tungsten silicide.

10. The semiconductor structure of claim 9, further comprising:
a silicide feature disclosed between the lower portion and the source/drain feature,
wherein the silicide feature comprises titanium silicide, tantalum silicide, cobalt silicide, nickel silicide, or tungsten silicide.

11. The semiconductor structure of claim 9,
wherein the lower portion tapers toward the source/drain feature,
wherein the upper portion tapers toward the lower portion.

12. The semiconductor structure of claim 11, wherein a bottom width of the upper portion is greater than a top width of the lower portion.

13. The semiconductor structure of claim 12,
wherein the bottom width is between about 14 nm and about 16 nm,
wherein the top width is between about 13 nm and about 15 nm.

14. The semiconductor structure of claim 9,
wherein the dielectric barrier layer comprises silicon nitride.

15. A method, comprising:
providing a workpiece that includes:
a fin structure having a channel region and a source/drain region,
a gate structure over the channel region,
a source/drain feature over the source/drain region,
a first etch stop layer extending along a sidewall of the gate structure to over the source/drain feature,
a first dielectric layer over the first etch stop layer,
a second etch stop layer over the first dielectric layer, the first etch stop layer, the gate structure, and
a second dielectric layer over the second etch stop layer;
forming a source/drain contact opening through the second dielectric layer, the second etch stop layer, the first dielectric layer, and the first etch stop layer;
depositing a dielectric barrier layer over the workpiece, including over the source/drain contact opening;
anisotropically etching back the dielectric barrier layer to expose the source/drain feature;
after the anisotropically etching backing, implanting the exposed source/drain feature with germanium to provide a uniform germanium distribution;
depositing a first metal liner over the source/drain contact opening;
performing an anneal process to convert the first metal liner into a second metal liner; and
after the annealing process, selectively etching back the second metal liner.

16. The method of claim 15, wherein the selectively etching back forms a third metal liner extending along surfaces of the second dielectric layer in the source/drain contact opening.

17. The method of claim 15, wherein the anneal process causes the first metal liner to react with the source/drain feature to form a silicide feature.

18. The method of claim 15, further comprising:
depositing a first metal layer in the source/drain contact opening; and depositing a second metal layer over the first metal layer in the source/drain contact opening.

19. The method of claim 18,
wherein the first metal liner comprises tantalum (Ta) and tantalum nitride (TaN), a mixture of cobalt (Co) and cobalt nitride (CON), a mixture of nickel (Ni) and nickel nitride (NiN), or a mixture of tungsten (W) and tungsten nitride (WN),
wherein the second metal liner comprises tantalum silicide, cobalt silicide, nickel silicide, or tungsten silicide.

20. The method of claim 15, wherein, after the anisotropically etching back the dielectric barrier layer, sidewalls of the source/drain contact opening remain covered by the dielectric barrier layer.

\* \* \* \* \*